United States Patent [19]

Ciaccio

[11] Patent Number: 5,276,587
[45] Date of Patent: Jan. 4, 1994

[54] PIVOTABLE ELECTRICAL CONNECTION APPARATUS

[75] Inventor: Michael P. Ciaccio, Canton, Mich.

[73] Assignee: Sundstrand Corporation, Rockford, Ill.

[21] Appl. No.: 44,918

[22] Filed: Apr. 8, 1993

Related U.S. Application Data

[63] Continuation of Ser. No. 693,643, Apr. 30, 1991, abandoned.

[51] Int. Cl.⁵ ............................................. H05K 7/20
[52] U.S. Cl. .................................. 361/707; 165/185; 174/16.3; 257/712; 361/704; 361/725; 361/773; 361/775; 361/785; 361/807; 361/810; 363/141; 439/341
[58] Field of Search ................. 165/80.3, 185; 174/16.3; 357/81; 307/150; 361/353, 340, 376, 382, 383, 386-; 363/141, 144; 439/341-

[56] References Cited

U.S. PATENT DOCUMENTS

| | | | |
|---|---|---|---|
| 3,336,561 | 8/1967 | Whiting | 339/17 |
| 3,522,490 | 8/1970 | Kauffman | 317/234 |
| 4,181,924 | 1/1980 | Thomas et al. | 361/353 |
| 4,344,106 | 8/1982 | West et al. | 361/386 |
| 4,688,151 | 8/1987 | Kraus et al. | 361/405 |
| 4,736,273 | 4/1988 | Vertongen et al. | 361/386 |
| 4,738,632 | 4/1988 | Schmidt et al. | 361/393 |
| 4,739,125 | 4/1988 | Watanabe et al. | 361/408 |
| 4,872,845 | 10/1989 | Korsunksy et al. | 439/70 |
| 5,046,172 | 9/1991 | Moreux et al. | 361/413 |
| 5,046,955 | 9/1991 | Olsson | 439/74 |

FOREIGN PATENT DOCUMENTS 1374666  11/1974  United Kingdom ............ 361/407

Primary Examiner—Gregory D. Thompson
Attorney, Agent, or Firm—Marshall, O'Toole, Gerstein, Murray & Borun

[57] ABSTRACT

An electrical device to be electrically mounted to a cooling mounting structure so that the electrical device is in intimate physical contact with the mounting structure for cooling the electrical device. The electrical device having a first pivot allowing contact for allowing the electrical device to be pivoted as it is mounted to the cooling mounting structure so that the electrical device is in intimate physical contact with the cooling mounting structure and for providing an electrical connection to the cooling mounting structure and the electrical device further having a second nonpivot allowing contact having a shape for providing electrical contact with the mounting structure when the electrical device is in intimate physical contact with the cooling mounting structure.

16 Claims, 1 Drawing Sheet

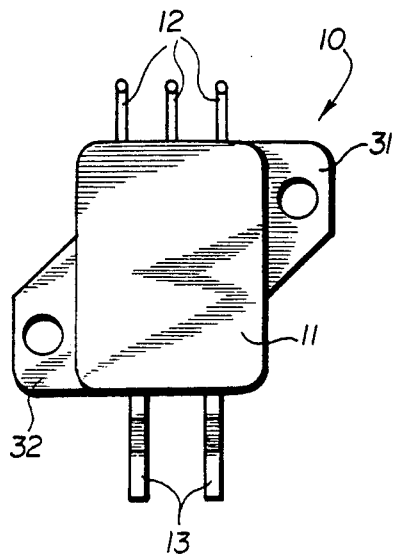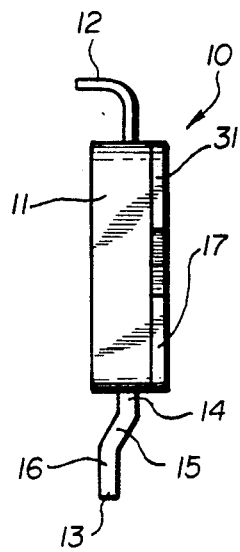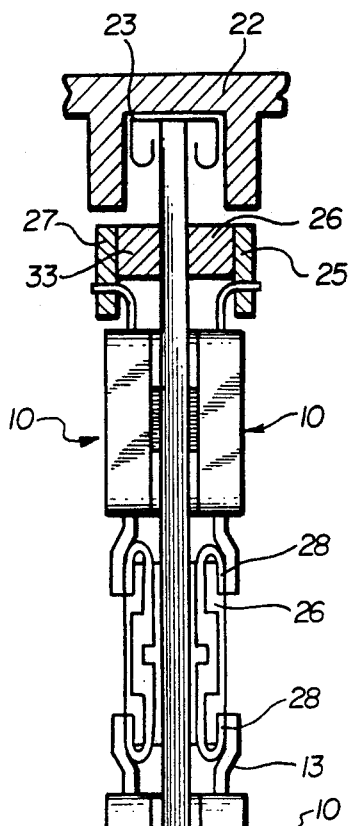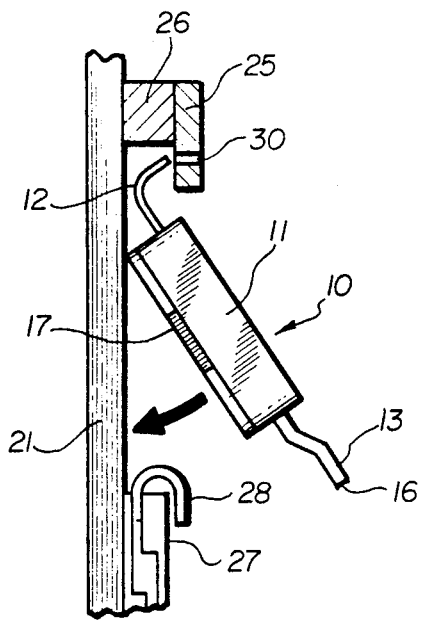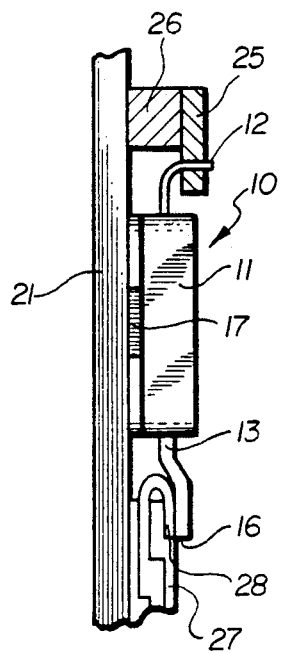

PIVOTABLE ELECTRICAL CONNECTION APPARATUS

This application is a continuation of application Ser. No. 07/693,643 filed Apr. 30, 1991, now abandoned.

BACKGROUND OF THE INVENTION

The present invention relates to electrical devices which can be electrically connected to a mounting structure in a manner that allows intimate contact between the electrical device and the mounting structure.

The present invention is particularly useful for electronic devices which carry both high current rated leads and low current rated leads. Standard electronic packages which are rated at 50 amps or above typically have large lugs to carry these high levels of current. Standard electronic packages which are rated at less than 50 amps typically have wire leads which are to be soldered to printed circuit boards. If such packages can be properly cooled, they can carry larger amounts of current.

It has been difficult in the past, however, to mount such packages to provide proper electrical connections and at the same time provide adequate cooling for the packages. This problem is particularly acute when the electrical package, such as an insulated gate bipolar transistor, has both high and low amperage leads. The high amperage leads may carry current as high as 50 or more amperes and must be attached to large bus bars. The low amperage leads, on the other hand, carry typically less than 3 amperes and must access a printed circuit board. A mounting arrangement must be provided for allowing the high amperage leads to be connected to the large bus bars and the low amperage leads to be connected to printed circuit boards while at the same time facilitating intimate physical engagement with a cooling surface for cooling the electrical package.

SUMMARY OF THE INVENTION

The present invention solves many of these problems by providing an electrical device to be electrically connected to a mounting structure such that the electrical device is in intimate contact with the mounting structure, the electrical device having a first pivot allowing contact for providing electrical contact with the mounting structure and for allowing the electrical device to be pivoted into intimate physical contact with the mounting structure, and a second nonpivot allowing contact having a shape for providing electrical contact with the mounting structure when the electrical device is in intimate physical contact with the mounting structure.

In further refinements of the invention, the first pivot allowing contact may be a pin engageable with a receptacle on the mounting structure and bent such that when the pin is inserted in the receptacle, the electrical device can be pivoted about the receptacle until the electrical device is in intimate physical contact with the mounting structure and the second nonpivot allowing contact may be a tab having a stepped shape such that when the electrical device is in intimate physical contact with the mounting structure, the tab provides a reliable electrical contact with a current-carrying connector on the mounting structure.

BRIEF DESCRIPTION OF THE DRAWINGS

These and other features and advantages of the invention will become more apparent from the following detailed description when taken in conjunction with the drawings in which:

FIG. 1 shows a front view of an electrical device to be mounted to a mounting structure;

FIG. 2 shows a side view of the electrical device of FIG. 1;

FIG. 3 shows several electrical devices of the type shown in FIGS. 1 and 2 mounted to a mounting structure; and, FIGS. 4 and 5 show the manner in which the electrical device is mounted to the mounting structure.

DETAILED DESCRIPTION

The present invention can be used in conjunction with the arrangement shown in copending application Ser. No. 07/781,886, field on Oct. 24, 1991 or in any other arrangement which requires intimate contact between an electrical device and a mounting structure. As shown in FIG. 1, electrical device 10 has body 11 with pin contacts 12 extending from one side of body 11 and tab contacts 13 extending from another side of body 11. Device 10 may have ears 31 and 32 with suitable holes therethrough so that device 10 can be fastened to a mounting structure.

As shown in FIG. 2, pin contacts 12 are bent in generally a right angle to facilitate the mounting of electrical device 10 to the mounting structure shown in more detail in FIG. 3. Tabs 13 have step 15 between first end 14 adjacent to the body 11 of electrical device 10 and outer end 16. Step 15 allows end 16 to engage a bus bar on the mounting structure when surface 17 of body 11 is in intimate contact with the surface of the mounting structure.

The mounting structure is shown in more detail in FIG. 3 and may be similar to the cooling rack disclosed in copending application 3741. This mounting structure includes cooling plate 21 attached to chassis 22 in part by clips 23 and 24. Printed circuit boards or electrical connectors 25 and 27, one on each side cooling plate 21, are mounted to cooling plate 21 by corresponding bus bar boards or electrical connectors 26 and 33. Printed circuit boards 25 are standard printed circuit boards having circuit paths deposited thereon and receptacles in the form of holes extending therethrough so that the pins of the electrical device can be inserted through the receptacle holes and soldered to appropriate circuit paths on the printed circuit board. Bus bar board 26 carries bus bars 28 shown in exaggerated form for connection to tabs 13 of electrical device 10.

In FIG. 3, a plurality of electrical devices 10 are mounted to the mounting structure such that surfaces 17 of each electrical device 10 are in intimate physical contact with cooling plate 21 in order to cool electrical devices 10.

FIGS. 4 and 5 depict the manner in which electrical device 10 is mounted to the mounting structure. Pins 12 are inserted through receptacles 30 from the underside of printed circuit board 25. Device 10 is then pivoted as pins 12 are inserted into receptacles 30 until surface 17 is in intimate physical contact with cooling plate 21. At this point, end 16 of stepped tab 13 is in flush electrical contact with bus bar 28. Pins 12 can now be affixed to printed circuit board 25 and tabs 13 can be fixed to bus bar 28 as by soldering.

Pins 12 are the low current carrying leads for electrical device 10 whereas tabs 13 can carry higher amounts of current.

What is claimed is:

1. A combination comprising:
    a mounting structure having a mounting surface;
    a first electrical connector being supported by said mounting structure, said first electrical connector having a surface and a receptacle through said surface of said first electrical connector, said surface of said first electrical connector being offset from, and being generally parallel to, said mounting surface,
    an electrical device having a device surface, said electrical device having a first electrical device contact insertable into said receptacle for electrical engagement with said first electrical connector, said receptacle and said first electrical device contact forming a pivot point, said first electrical device contact being arranged so that, when said first electrical device contact is inserted into said receptacle for electrical engagement with said first electrical connector, said electrical device may be pivoted about said pivot point until said device surface is in intimate physical engagement with said mounting surface.

2. The combination of claim 1 wherein said combination comprises a second electrical connector supported by said mounting structure, and said electrical device comprises a second electrical device contact arranged for electrical engagement with said second electrical connector when said device surface is in intimate physical engagement with said mounting surface.

3. The combination of claim 2 wherein said first electrical device contact is generally right angular.

4. The combination of claim 3 wherein said electrical device has a first side, said first side being generally perpendicular to said device surface when said electrical device is mounted to said mounting structure, and wherein said electrical device has a second side, said second side being generally perpendicular to said device surface when said electrical device is mounted to said mounting structure, said first electrical device contact extending from said first side and said second electrical device contact extending from said second side.

5. The combination of claim 4 wherein said second electrical device contact has an end stepped in a direction away from said mounting surface so that said stepped end makes electrical contact with said second electrical connector when said device surface is in intimate physical contact with said mounting surface.

6. The combination of claim 5 wherein said first electrical device contact is arranged to carry only low level current and said second electrical device contact is arranged to carry high level current.

7. A combination comprising:
    a mounting structure having a cooling surface for cooling devices mounted thereto;
    a first electrical connector being supported by said mounting structure and having a surface and a receptacle in said surface of said first electrical connector, said surface of said first electrical connector being offset from said cooling surface to define a space between said cooling surface and said surface of said first electrical connector;
    a second electrical connector being supported by said mounting structure, said second electrical connector being offset from said cooling surface; and
    an electrical device having a device surface, said electrical device having a first electrical device contact insertable through said space and into said receptacle for electrical engagement with said first electrical connector, said first electrical device contact being arranged so that said electrical device may be pivoted about said receptacle until said device surface is in thermal transfer engagement with said cooling surface, said electrical device further having a second electrical device contact arranged for electrical engagement with said second electrical connector when said device surface is in thermal transfer engagement with said cooling surface.

8. The combination of claim 7 wherein said first electrical device contact is generally right angular.

9. The combination of claim 8 wherein said electrical device has a first side, said first side being generally perpendicular to said device surface when said electrical device is mounted to said mounting structure, and wherein said electrical device has a second side, said second side being generally perpendicular to said device surface when said electrical device is mounted to said mounting structure, said first electrical device contact extending from said first side and said second electrical device contact extending from said second side.

10. The combination of claim 9 wherein said second electrical device contact has an end stepped in a direction away from said cooling surface so that said stepped end makes electrical contact with said second electrical connector when said device surface is in intimate physical contact with said mounting surface.

11. The combination of claim 10 wherein said first electrical device contact is arranged to carry only low level current and said second electrical device contact is arranged to carry high level current.

12. A combination comprising:
    a mounting structure having a mounting surface;
    a first electrical connector being supported by said mounting structure, said first electrical connector having a surface and a receptacle in said surface of said first electrical connector, said surface of said first electrical connector being offset from said mounting surface;
    a second electrical connector supported by said mounting surface;
    an electrical device having a device surface, said electrical device having a first electrical device contact insertable into said receptacle for electrical engagement with said first electrical connector, said electrical device having a second electrical device contact, said receptacle and said first electrical device contact forming a pivot point, said first electrical device contact being arranged so that, when said first electrical device contact is inserted into said receptacle for electrical engagement with said first electrical connector, said electrical device may be pivoted about said pivot point until said device surface is in intimate physical engagement with said mounting surface and until said second electrical device contact engages said second electrical connector when said device surface is in intimate physical engagement with said mounting surface.

13. The combination of claim 12 wherein said first electrical device is generally right angular.

14. The combination of claim 13 wherein said electrical device has a first side, said first side being generally perpendicular to said device surface when said electrical device is mounted to said mounting structure, and wherein said electrical device has a second side, said second side being generally perpendicular to said device surface when said electrical device is mounted to said mounting structure, said first electrical device contact extending from said first side and said second electrical device contact extending from said second side.

15. The combination of claim 14 wherein said second electrical device contact has an end stepped in a direction away from said mounting surface so that said stepped end makes electrical contact with said second electrical connector when said device surface is in intimate physical contact with said mounting surface.

16. The combination of claim 15 wherein said first electrical contact is arranged to carry only low level current and said second electrical device contact is arranged to carry high level current.

* * * * *